(12) United States Patent
White et al.

(10) Patent No.: US 8,044,738 B2
(45) Date of Patent: Oct. 25, 2011

(54) OSCILLATOR APPARATUS

(75) Inventors: Richard White, Cambridge (GB); Jani Kivoja, Cambridgeshire (GB)

(73) Assignee: Nokia Corporation, Espoo (FI)

( * ) Notice: Subject to any disclaimer, the term of this patent is extended or adjusted under 35 U.S.C. 154(b) by 112 days.

(21) Appl. No.: 12/584,774

(22) Filed: Sep. 10, 2009

(65) Prior Publication Data

US 2011/0057733 A1   Mar. 10, 2011

(51) Int. Cl.
*H03B 5/30* (2006.01)
*H03H 9/125* (2006.01)

(52) U.S. Cl. .................. 331/156; 331/154; 331/116 M; 331/46; 977/732; 977/932; 977/742; 333/197

(58) Field of Classification Search .............. 331/116 R, 331/116 M, 154, 156, 46, 55, 49; 333/186, 333/197, 200; 977/724, 732, 932, 742
See application file for complete search history.

(56) References Cited

U.S. PATENT DOCUMENTS

| 6,424,074 | B2* | 7/2002 | Nguyen .................. 310/309 |
| 2008/0204152 | A1 | 8/2008 | Feng et al. ................ 331/34 |
| 2010/0271003 | A1* | 10/2010 | Jensen et al. ............. 324/76.49 |

FOREIGN PATENT DOCUMENTS

WO   WO-2005112126 A1   11/2005

OTHER PUBLICATIONS

Feng, X.L., C. J. White, A. Hijimiri, and M.L. Roukes (2008) A self-sustaining ultrahigh-frequency nanoelectromechanical oscillator Nat Nano 3(6), 342 (346) May 25, 2008.
Ayari, A.; Vincent, P.; Perisanu, S.; Choueib, M.; Gouttenoire, V.; Bechelancy, M.; Cornu, D. & Purcell, S. T.; "self—oscillations in field emission nanowire mechanical resonators: A Nanometric dc-ac Conversion", Nano Letters, 2007, 7, 2252-2257.
Jensen, K., K. Kim, and A Zetti (2008) An Atomic-Resolution Nanomechanical Mass Sensor, Nat Nano 3 (9), 533(537) Jul. 20, 2008.
Jensen K., J. Welden, H. Garcia, and A. Zetti (2007), Nanotube Radio, Nano Lett. 7 (11), 3508(3511).

* cited by examiner

*Primary Examiner* — Ryan Johnson
(74) *Attorney, Agent, or Firm* — Harrington & Smith

(57) ABSTRACT

An apparatus including a resonator electrode and a second electrode separated from the resonator electrode by a gap having a size that facilitates electron transfer across the gap, wherein the resonator electrode is a resonator electrode mounted for oscillatory motion relative to the second electrode that results in a size of the gap between the resonator electrode and the second electrode being time variable; a feedback circuit configured to convey an electron transfer signal dependent upon electron transfer across the gap as a feedback signal; and a drive electrode adjacent the resonator electrode configured to receive a feedback signal from a feedback circuit configured to provide a time-varying feedback signal dependent upon electron transfer across a gap.

20 Claims, 2 Drawing Sheets

US 8,044,738 B2

OSCILLATOR APPARATUS

FIELD OF THE INVENTION

Embodiments of the present invention relate to an oscillator apparatus. In particular, an oscillator apparatus that uses an electro-mechanically produced positive feedback signal.

BACKGROUND TO THE INVENTION

An oscillator requires that a resonator is excited into oscillation. For oscillators without feedback, the losses (damping) associated with the oscillation means that a continuous oscillating driving signal at the frequency of oscillation or at some multiple of the operational frequency is required to maintain oscillation. However, when an oscillating signal produced by the oscillator itself is fed back to further excite the oscillator with appropriate amplification and phase control, then the oscillations can be sustained without the need for the oscillating driving signal.

BRIEF DESCRIPTION OF VARIOUS EMBODIMENTS OF THE INVENTION

According to various, but not necessarily all, embodiments of the invention there is provided an apparatus comprising: a first electrode and a second electrode separated from the first electrode by a gap having a size that facilitates electron transfer across the gap, wherein the first electrode is a resonator electrode mounted for oscillatory motion relative to the second electrode that results in a size of the gap between the first electrode and the second electrode being time variable; a feedback circuit configured to convey an electron transfer signal dependent upon electron transfer across the gap as a feedback signal; and a drive electrode adjacent the first electrode configured to receive a feedback signal from a feedback circuit configured to provide a feedback signal dependent upon electron transfer across a gap.

According to various, but not necessarily all, embodiments of the invention there is provided an apparatus comprising: a first electrode and a second electrode configured such that first relative motion of the first and second electrode vary a gap between the first and second electrodes; means for conveying an electron transfer signal dependent upon electron transfer across the gap; means for maintaining that a probability of electron transfer across the non-conductive gap is dependent on a distance across the gap; and means for changing a field through which first electrode moves in dependence upon a transfer signal.

According to various, but not necessarily all, embodiments of the invention there is provided a method comprising: conveying an oscillatory electron transfer current that is dependent upon electron transfer across a gap between a first oscillating electrode and a second electrode; and driving the first oscillating electrode using an oscillatory electron transfer current that is dependent upon electron transfer across a gap between a third oscillating electrode and a fourth electrode

BRIEF DESCRIPTION OF THE DRAWINGS

For a better understanding of various examples of embodiments of the present invention reference will now be made by way of example only to the accompanying drawings in which.

DETAILED DESCRIPTION OF VARIOUS EMBODIMENTS OF THE INVENTION

Figure 1:
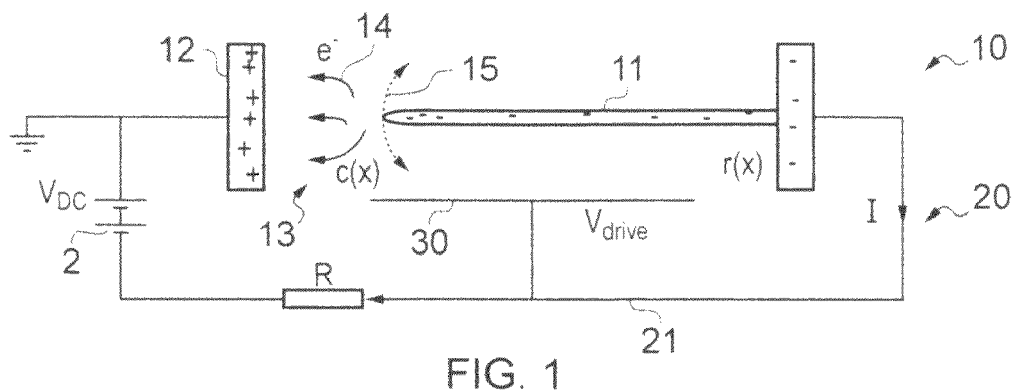
FIG. 1 schematically illustrates an apparatus comprising a single oscillator.

FIGS. 1 to 4 schematically illustrates an apparatus 10 comprising:
a first electrode 11 and a second electrode 12 separated from the first electrode 11 by a gap 13 having a size that facilitates electron transfer 14 across the gap 13, wherein the first electrode 11 is a resonator electrode mounted for oscillatory motion 15 relative to the second electrode 12 that results in a size of the gap 13 between the first electrode 11 and the second electrode 12 being time variable;
a feedback circuit 20 configured to convey an electron transfer signal (I) dependent upon electron transfer 14 across the gap 13 as a feedback signal 21; and
a drive electrode 30 adjacent the first electrode 11 configured to receive a feedback signal 21 from a feedback circuit configured to provide a feedback signal 21 dependent upon electron transfer across a gap.

Referring to FIG. 1, this Figure illustrates an apparatus 10 comprising a single oscillator. The drive electrode 30 adjacent the first electrode 11 receives the feedback signal 21 from the feedback circuit 20 (as opposed to a different feedback circuit associated with a different first electrode of a different oscillator).

The apparatus 10 comprises: a first resonator electrode 11, a second electrode 12 separated from the first electrode 11 by a gap 13, an electrical energy source 2 for providing a bias voltage across the gap 13 that facilitates electron transfer 14 across the gap 13, a feedback circuit 20 configured to convey an electron transfer signal (I) dependent upon electron transfer 14 across the gap 13 as a feedback signal 21, and a drive electrode 30 adjacent the first electrode 11 configured to receive the feedback signal 21 from the feedback circuit 20.

The first resonator electrode 11 is mounted for oscillatory motion 15 relative to the second electrode 12.

The first resonator may be a mechanically vibrating element. In the illustrated example it is a stiff cantilever. In other implementations the first resonator may use other oscillatory systems based upon physical distortion of a body such as, for example, surface distortions or waves or shape distortions of a three dimensional body In the illustrated example, the apparatus 10 is a nanoelectromechanical system (NEMS) because it has at least one dimension below 1 micron. For example, the width and height of the cantilever operating as the first electrode 11 have dimensions less than 1 micron.

In some embodiments, the width may range between 10 and 500 nm and in other embodiments widths outside this range may be used. In some embodiments, the length may range between 100 nm and 10 microns and in other embodiments lengths outside this range may be used. The geometry of the cantilever determines its fundamental resonant frequency.

The first resonator electrode 11 may be, for example, a nanowire e.g. doped silicon, metal, or carbon nanotube or a semiconductor nanowire.

The first resonator electrode 11 may be formed, for example, using a top-down and/or bottom up approach. A top-down approach uses chemical or physical processes to remove material to create a structure. A bottom-up approach synthesizes a structure by physical and/or chemical processes that self-assemble the structure.

In some embodiments, no external stimulus is required to set the first resonator electrode 11 into oscillatory motion. Thermal energy associated with the system is typically sufficient to set the first resonator electrode 11 into motion, with the major component of its motion being associated with its fundamental mode. In other embodiments independent stimuli may be used to set the first resonator electrode 11 into oscillatory motion. The oscillatory motion 15 of the first electrode 11 relative to the second electrode 12 results in a size of the gap 13 between the first electrode 11 and the second electrode 12 being time variable. The size of the gap 13 changes as the first resonator electrode 11 oscillates.

The gap 13 between the first resonator electrode 11 and the second electrode 12 introduces a barrier between the first resonator electrode 11 and the second electrode 12. The gap may comprise a vacuum or a non-conductive medium. A non-conductive medium is a medium that requires the development of a significant potential difference across it before it conducts any electrons across it. There is no linear relationship between potential difference and current for small potential difference values. The non-conductive material may be a fluid. It may, for example, be a gas or gas mixture such as air or a liquid.

The electrical energy source 2 is configured to provide a potential difference across the gap 13. In the illustrated example, the electrical energy source is one or more battery cells which provide a substantially constant bias direct current (DC) voltage. The DC bias controls the amplitude of the AC electron transfer signal (I) and therefore allows control of the oscillator's transfer function, $H(j\omega_0)$, such that the Barkhausen criterion can be satisfied for self-sustained oscillation. The Barkhausen criterion is $H(j\omega_0)G(j\omega_0)=1$, where $G(j\omega_0)$ is the gain of the feedback loop and $H(j\omega_0)$ is the transfer function of the oscillator at resonant frequency $\omega_0$.

The combination of the potential difference across the gap 13 and the non-conductive gap 13 results in charge build up on the first electrode 11 and the second electrode 12. In the illustrated example, the first electrode is a cathode and the second electrode is an anode. The applied potential difference and the size of the gap are configured to provide an electric field that facilitates electron transfer 14 across the gap 13 at least as the gap narrows with movement of the first electrode 11.

The probability of electron transfer 14 across the gap 13 is dependent on the size of the gap as it is dependent upon the electric field required to overcome a potential barrier and liberate an electron from the material of the first electrode.

The potential barrier may be perceived as a property of the electrode material e.g. work function for field emission.

The potential barrier may be perceived as a property of the gap e.g. potential barrier in quantum mechanical tunneling The feedback circuit 20 is configured to convey the electron transfer signal (I) dependent upon electron transfer 14 across the gap 13 as a feedback signal 21 to the drive electrode 30.

The feedback circuit 20 is in this embodiment an 'internal feedback' circuit. This means that the feedback circuit 20 comprises an interconnect that has a path length that is of the same order of magnitude as the size of the first resonator electrode 11. That is, it is mesoscopic. In this embodiment, the interconnect does not travel to an external circuit which is at a different, macroscopic scale. However, in other embodiments. the feedback circuit may be an 'external feedback' circuit. This means that the feedback circuit 20 comprises an interconnect that travels to an external circuit which is at a different, macroscopic scale.

The drive electrode 30 is positioned adjacent and close to the first resonator electrode 11 but not in contact with the first resonator electrode 11. The drive electrode 30 develops an electric field between the first resonator element 11 and the drive electrode 30 that depends upon the feedback signal 21.

The surface area of the drive electrode 30 and its separation from the first resonator electrode 11 are configured so that there is sufficient capacitative coupling between the drive electrode 30 and the first resonator electrode 11. The greater the capacitance between the drive electrode 30 and the first resonator electrode 11, the greater the force exerted by the drive electrode on the first resonator electrode 11.

As the first resonator electrode 11 oscillates it produces an oscillatory feedback signal 21 which in turn produces an oscillatory force on the first resonator electrode 11 creating a positive feedback system that self-sustains oscillations of the first resonator electrode 11 without the need for an externally applied oscillating driving signal or external phase or gain control. Self-sustained oscillation is achieved when the feedback circuit parameters, largely controlled by the DC potential source, satisfy the Barkhausen criterion.

The mechanical impedance of the first resonator electrode 11 (stiffness of the cantilever) is small so that the energy provided by the electric field of drive electrode is sufficient to maintain oscillations.

The mechanical impedance of the first resonator electrode 11 (stiffness of the cantilever) may also be used to provide stabilization. For example, the stiffness of the cantilever is non-linear increasing in proportion to the cube of its displacement.

Figure 2:
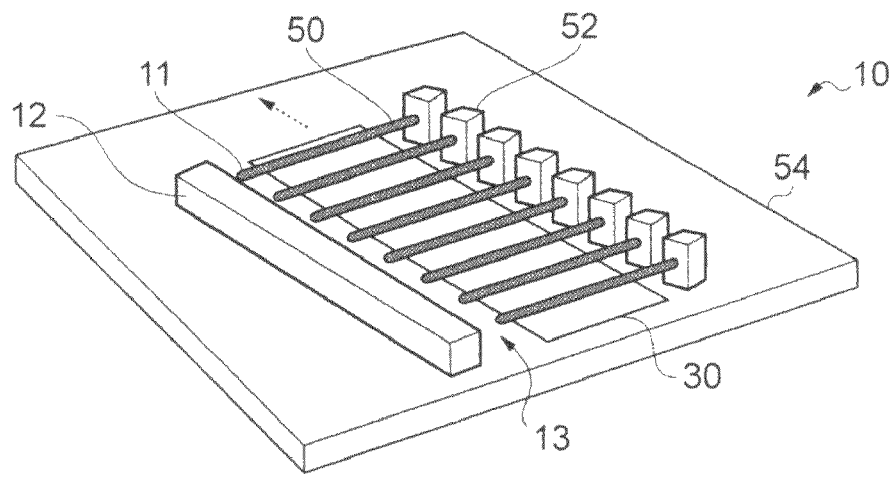
FIG. 2 schematically illustrates an apparatus comprising a plurality of oscillators having a shared drive electrode.

FIG. 2 illustrates an apparatus 10 comprising a plurality of oscillators.

Each oscillator comprises: a first resonator electrode 11, a second electrode 12 separated from the first electrode 11 by a gap 13, a feedback circuit 20 configured to convey an electron transfer signal (I) dependent upon electron transfer 14 across the gap 13 as a feedback signal 21, and a drive electrode 30.

The oscillators, in this example, share a common electrical energy source 2 for providing a bias voltage across the gap 13 that facilitates electron transfer 14 across the gap 13, The oscillators, in this example, share a common drive electrode 30 adjacent the first electrodes 11 of the oscillators configured to receive the feedback signals 21 from the feedback circuits 20 of the oscillators.

The feedback signals 21 from the separate oscillators are combined and the combined superposition of generated feedback signals is provided to the common drive electrode 30. This imposes coupling between individual oscillators such that synchronization between the oscillators can occur i.e. the first resonant electrodes 11 of the different oscillators can move in phase.

The first resonator electrodes 11 of the oscillators in the illustrated example are formed from separate nanowires 50 each of which is held in a cantilevered arrangement by a clamp 52 mounted on a substrate 54. The common drive electrode 30 and the common second electrode 12 are also mounted on the substrate 54.

The substrate 54 may, for example be formed from sapphire, glass, or oxidized silicon.

Figure 3:
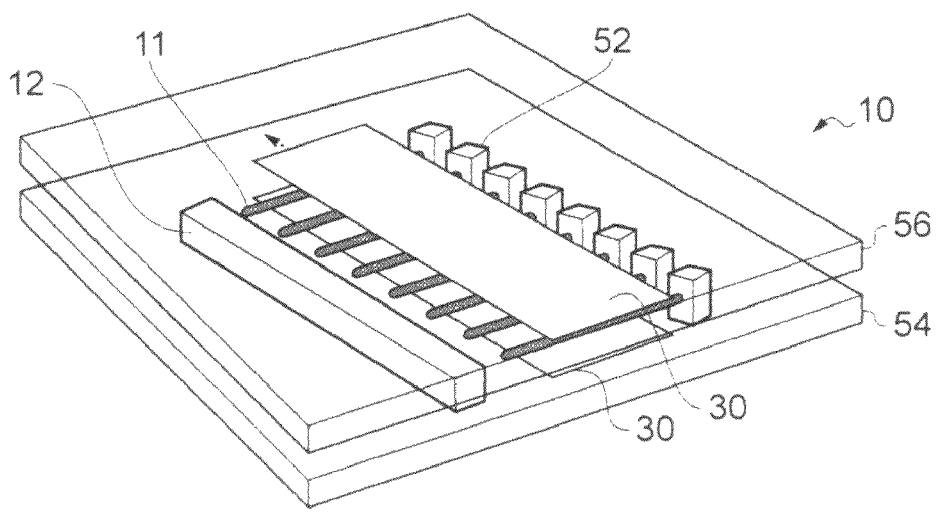
FIG. 3 schematically illustrates an apparatus comprising a plurality of oscillators having opposing shared drive electrodes.

FIG. 3 illustrates an apparatus 10 comprising a plurality of oscillators similar to that illustrated in FIG. 2. However, the apparatus not only has a bottom substrate 54 supporting a common drive electrode 30, it also has a top substrate 54 supporting a further common drive electrode 30.

The feedback signals 21 from the separate oscillators are combined and the combined superposition of generated feedback signals is provided to two opposing common drive electrodes 30 that are in phase with each other. This imposes coupling between individual oscillators such that synchronization between the oscillators can occur. Some of the first resonator electrodes 11 of the different oscillators can move in phase (driven by the same one of the two opposing drive electrodes) and others may move in anti-phase (driven by different ones of the two opposing drive electrodes). Each oscillator can be in phase or in anti-phase with each other oscillator within the array. I.e. each oscillator occupies one of two phase states.

Figure 4:
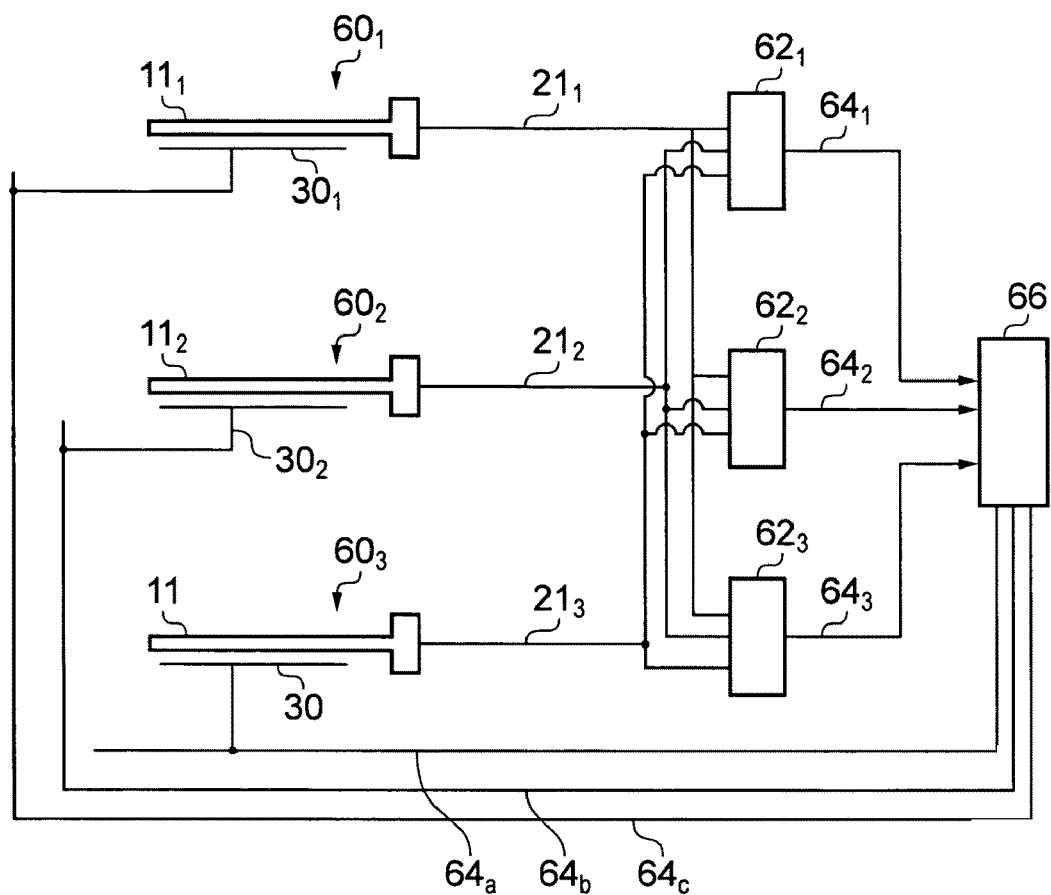
FIG. 4 schematically illustrates an apparatus comprising a plurality of oscillators and control circuitry including combination circuitry and routing circuitry.

FIG. 4 schematically illustrates an apparatus 10 comprising a plurality of oscillators $50_1$, $50_2$ and $50_3$ and control circuitry including the combination circuitry $62_1$ and the routing circuitry $66_3$.

Each oscillator $50_n$ comprises: a first resonator electrode $11_n$, a second electrode $12_n$ separated from the first electrode $11_n$ by a gap, a feedback circuit configured to convey an electron transfer signal (I) dependent upon electron transfer across the gap as a feedback signal $21_n$ and a drive electrode $30_n$ adjacent the first electrode $11_n$ configured to receive a feedback signal from a feedback circuit.

The plurality of feedback signals $21_1$, $21_2$ and $21_3$ are provided as inputs to first combination circuitry $62_1$. The first combination circuitry $62_1$ creates a summation of selected ones of its inputs and provides the summation as an output signal $64_1$. The summation may in some embodiments be selectively weighted.

The plurality of feedback signals $21_1$, $21_2$ and $21_3$ are provided as inputs to second combination circuitry $62_2$. The second combination circuitry $62_2$ creates a summation of selected ones of its inputs and provides the summation as an output signal $64_2$. The summation may in some embodiments be selectively weighted.

The plurality of feedback signals $21_1$, $21_2$ and $21_3$ are provided as inputs to third combination circuitry $62_3$. The third combination circuitry $62_3$ creates a summation of selected ones of its inputs and provides the summation as an output signal $64_3$. The summation may in some embodiments be selectively weighted.

Routing circuitry $66_3$ receives the plurality of output signals $64_1$, $64_2$, $64_3$ and selectively provides one of the plurality of output signals $64_1$, $64_2$, $64_3$ as feedback signal $64_a$ to the drive electrode $30_1$ of the first oscillator $60_1$, selectively provides one of the plurality of output signals $64_1$, $64_2$, $64_3$ as feedback signal $64_b$ to the drive electrode $30_2$ of the second oscillator $60_2$, and selectively provide one of the plurality of output signals $64_1$, $64_2$, $64_3$ as feedback signal $64_c$ to the drive electrode $30_3$ of the third oscillator $60_3$.

It is therefore possible to temporarily or permanently configure the apparatus 10 such that the drive electrode of a first oscillator $60_1$ is configured to receive a feedback signal $21_2$ from the feedback circuit of a second oscillator $60_2$.

It is therefore possible to temporarily or permanently configure the apparatus such that the drive electrode of a first oscillator $60_1$ is configured not to receive a feedback signal $21_1$ from the feedback circuit of the first oscillator $60_1$.

It is also possible to provide the same feedback signal 64 to a plurality of drive electrodes 30 of respective oscillators 60. The plurality of drive electrodes 30 then operate as a common drive electrode.

The combination circuitry $62_1$ and the routing circuitry $66_3$ are typically provided as external circuitry that is not integrated 'on-chip' with the oscillators. The size scale of the combination circuitry $62_1$ and the routing circuitry 66 is typically macroscopic, that is at a very much greater scale than that of the oscillators 60.

In the drawings and the foregoing description components may be illustrated and/or described as connected. It should be understood that components may instead be operationally coupled and that any number or combination of intervening elements can exist (including no intervening elements).

Applications of the apparatus 10 described in the preceding paragraphs include, but are not limited to: pattern recognition, data classification, radio-frequency electronics, signal processing, sensing, and encoding/decoding.

Although embodiments of the present invention have been described in the preceding paragraphs with reference to various examples, it should be appreciated that modifications to the examples given can be made without departing from the scope of the invention as claimed.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

We claim:

1. An apparatus comprising:
a plurality of oscillators, comprising:
one resonator electrode for each oscillator, each resonator electrode being separated from one of one or more additional electrodes by a gap having a size configured to facilitate electron transfer across the gap, wherein each of the resonator electrodes is mounted for oscillatory motion relative to the one of the one or more additional electrodes such that a size of the gap between the resonator electrode and the one of the one or more additional electrodes is time variable;
one or more drive electrodes, each of the one or more drive electrodes being configured to drive one or more of the resonator electrodes;
a feedback circuit configured to convey an electron transfer signal dependent upon electron transfer across the gap as a feedback signal; wherein
each of the one or more resonator electrodes is coupled to one of the one or more drive electrodes each of the one or more drive electrodes being configured to receive the feedback signal from the feedback circuit, at least one of the one or more drive electrodes being a common drive electrode to which two or more of the resonator electrodes are coupled.

2. An apparatus as claimed in claim 1, further comprising an electrical energy source for providing a constant bias voltage which is used to develop a voltage across the gap.

3. An apparatus as claimed in claim 1, wherein the feedback circuit comprises an interconnect having a path length of same order of magnitude as size of the resonator electrode.

4. An apparatus as claimed in claim 1, wherein at least one of the resonator electrodes is a cantilever.

5. An apparatus as claimed in claim 1, wherein the apparatus is a nanoelectromechanical system and each of the plurality of resonator electrodes is a nanostructure.

6. An apparatus as claimed in claim 1, wherein the one or more drive electrodes are sized and positioned so that a capacitance between one of the one or more drive electrodes and each resonator electrode enables self-sustaining oscillatory motion of each resonator electrode.

7. An apparatus as claimed in claim 1, wherein, in use, a probability of electron transfer across the gap is dependent on a size of the gap, electron transfer across a time varying gap produces a time varying feedback signal, and a time varying feedback signal applied to the drive electrode provides a time varying field through which the resonator electrode moves.

8. An apparatus as claimed in claim 1, wherein the drive electrode adjacent each of the resonator electrodes is configured to receive the feedback signal from the feedback circuit.

9. An apparatus comprising:
a plurality of oscillators, the plurality of oscillators comprising:
one resonator electrode for each oscillator, with each of the resonator electrodes being separated from one of one or more additional electrodes by a gap having a size configured to facilitate electron transfer across the gap, wherein the resonator electrode is mounted for oscillatory motion relative to the one of one or more additional electrodes such that a size of the gap between the resonator electrode and the additional electrode is time variable; and
a feedback circuit configured to convey an electron transfer signal dependent upon electron transfer across the gap as a feedback signal;
one or more drive electrodes, for driving the resonator electrode;
a control mechanism configured to combine feedback signals of a selected plurality of oscillators to produce a combined feedback signal for one or more of the drive electrodes;
and wherein
each of the resonator electrodes is coupled to one of the one or more drive electrodes, and wherein each of the one or more drive electrodes is configured to receive the feedback signal from the feedback circuit.

10. An apparatus as claimed in claim 9, wherein a common additional electrode is used for some or all of the plurality of oscillators.

11. An apparatus as claimed in claim 9, wherein the drive electrode of a first oscillator is configured to receive a feedback signal from the feedback circuit of a second oscillator.

12. An apparatus as claimed in claim 11, wherein the drive electrode of the first oscillator is configured not to receive a feedback signal from the feedback circuit of the first oscillator.

13. An apparatus as claimed in claim 9, further comprising a control mechanism configured to select which drive electrodes receive feedback signals from which oscillators.

14. An apparatus as claimed in claim 9, further comprising a control mechanism configured to selectively connect a drive electrode of a first oscillator to receive a selected feedback signal from any one of a plurality of oscillators.

15. A method comprising:
conveying an oscillatory electron transfer current that is dependent upon electron transfer across a gap between each of a plurality of resonator electrodes and one of one or more additional electrodes; and
driving each of the resonator electrodes using one of one or more drive electrodes, each of the one or more drive electrodes being configured to receive a feedback signal from a feedback circuit that is configured to provide a feedback signal dependent upon the electron transfer across the gap, at least one of the one or more drive electrodes being a common drive electrode to which two or more of the resonator electrodes are coupled.

16. A method as claimed in claim 15, wherein at least one of the one or more additional electrodes is a common additional electrode shared by at least two of the resonator electrodes.

17. A method as claimed in claim 15, wherein at least one of the resonator electrodes is a cantilever.

18. An apparatus comprising:
a plurality of oscillators, wherein each of the oscillators comprises:
a resonator electrode and a second electrode separated from the resonator electrode by a gap having a size configured to facilitate electron transfer across the gap, wherein the resonator electrode is mounted for oscillatory motion relative to the second electrode such that a size of the gap between the resonator electrode and the second electrode is time variable;
a feedback circuit configured to convey an electron transfer signal dependent upon electron transfer across the gap as a feedback signal; and
a first common drive electrode, shared between the resonators, disposed to drive each of the resonator electrodes, wherein the common drive electrode is configured to receive the feedback signal from the feedback circuit.

19. The apparatus of claim 18, further comprising a second common drive electrode, shared between the resonators, disposed to drive each of the resonator electrodes and disposed oppositely from the first common drive electrode, wherein the second common drive electrode is configured to receive the feedback signal from the feedback circuit.

20. The apparatus of claim 18, wherein at least one of the resonator electrodes is a cantilever.

\* \* \* \* \*